（12) United States Patent
Kuroki et al.

(10) Patent No.: US 6,392,914 B1
(45) Date of Patent: May 21, 2002

(54) STORAGE DEVICE ENCOMPASSING A DIFFUSION PROCESS AND A DISSIPATION PROCESS OF INFORMATION CARRIERS AND STORAGE METHOD THEREOF

(75) Inventors: Yoshihiko Kuroki, Kanagawa; Yoshifumi Mori, Chiba; Ryuichi Ugajin, Tokyo, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/210,583

(22) Filed: Dec. 14, 1998

(30) Foreign Application Priority Data

Jul. 10, 1998 (JP) ............................................ 10-195822

(51) Int. Cl.[7] .......................... G11C 13/00; H01L 29/88
(52) U.S. Cl. ...................... 365/118; 365/112; 365/217; 365/151; 257/21; 257/23; 257/25; 257/14
(58) Field of Search ................................ 365/118, 151, 365/217, 112, 114; 257/21, 23, 25, 14

(56) References Cited

U.S. PATENT DOCUMENTS 4,912,531 A * 3/1990 Reed et al. .................... 257/17
5,347,140 A * 9/1994 Hirai et al. .................... 257/17
5,589,692 A * 12/1996 Reed ............................ 257/23

OTHER PUBLICATIONS

Mohan et al., "Device and circuit simulation of quantum electronic devices", IEEE Transactions on Computer–Aided Design of Integrated Circuits and Systems, vol. 14, No. 6, pp. 653–662.*

Jones et al., "High resolution real–time three–dimensional imaging through turbid media using photorefractive holography", Conference on Lasers and Electro–Optics, May 3–8, 1998, p. 212.*

* cited by examiner

Primary Examiner—Andrew Q. Tran
(74) Attorney, Agent, or Firm—Sonnenschein, Nath & Rosenthal

(57) ABSTRACT

A nonlinear coupling oscillator array is configured in such a manner that, for example, two layers in each of which a number of quantum dots as oscillators are arranged two-dimensionally are laid one on another. Adjacent quantum dots in the upper layer have tunnel coupling that exhibits a nonlinear current-voltage characteristic. The quantum dots in the upper layer receive an input of initial data/bias current, and each quantum dot in the upper layer is coupled with one quantum dot in the lower layer via a gate function having a time constant. Adjacent quantum dots in the lower layer do not interact with each other and the quantum dots in the lower layer are connected to the ground. For example, initial data are input by generating electron-hole pairs by applying light having an intensity profile corresponding to data, and injecting resulting electrons into the quantum dots of the upper layer. For example, bias current is given by applying light having an intensity profile that is constant temporally and spatially. As time elapses from the input of initial data, there appears a dynamic pattern, that is, a rotating spiral pattern, corresponding to the initial data. The data is stored in this manner.

21 Claims, 8 Drawing Sheets

FIG. 3
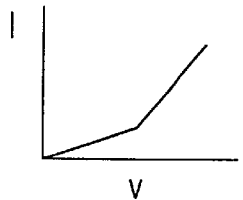
FIG. 4
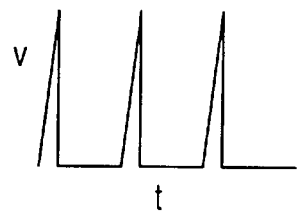
FIG. 5A  DATA INPUT
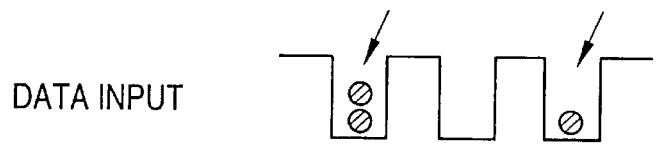
FIG. 5B  BIAS
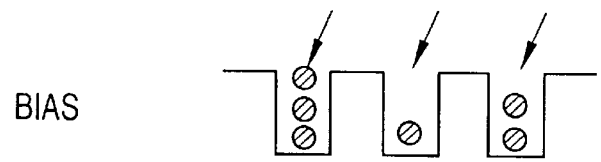
FIG. 5C  GATE OPENING
(ENERGY DISSIPATION)
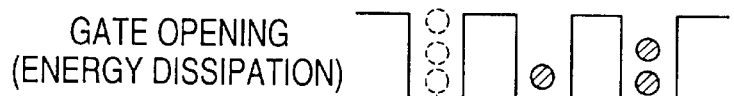
FIG. 5D  NONLINEAR DIFFUSION
(DATA SCATTERING)
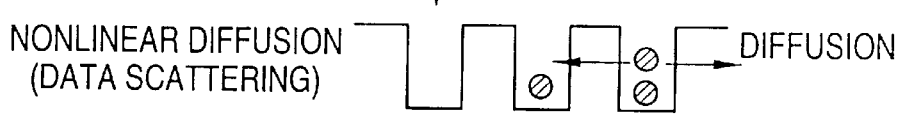
⊓⊔ QUANTUM DOT
⊘ ELECTRON

STORAGE DEVICE ENCOMPASSING A DIFFUSION PROCESS AND A DISSIPATION PROCESS OF INFORMATION CARRIERS AND STORAGE METHOD THEREOF

BACKGROUND OF THE INVENTION

1. Field of the Invention

The present invention relates to a storage method and device and an information processing method and apparatus based on a novel principle of operation.

2. Description of the Related Art

Conventional semiconductor memories store information by accumulating electrons in memory cells. That is, it can be said that conventional semiconductor memories have the basic mechanism that information is held statically.

Conventional semiconductor memories of the above kind have a problem that the influence of thermal noise becomes more remarkable and stored data is rendered less stable as the degree of miniaturization of a device increases, which obstructs high-density storage. Further, conventional semiconductor memories consume much power because a sufficient number of electrons to surpass thermal noise are needed for storage. Therefore, it is substantially impossible to realize, in the form of a semiconductor memory, a system connecting a number of storage elements equivalent to, for example, brain cells of a living body.

OBJECT AND SUMMARY OF THE INVENTION

An object of the present invention is therefore to provide a storage method and device which enables information to be stored stably at a high density with low power consumption without being influenced by thermal noise, as well as an information processing method and apparatus utilizing such a storage method.

The present inventors have conducted concentrated studies to solve the above problems in the art. Those studies will be summarized below.

The inventors have conducted various studies by making full use of computer simulation technologies based on various physical models, and have found a storage method based on a novel principle of operation that is entirely different than in conventional methods, as well as an information processing method utilizing such a storage method. These methods have features that include a diffusion process and a dissipation process of information carriers such as electrons, and at least one of the diffusion and dissipation processes being nonlinear. By virtue of the inclusion of those processes, input information that is input as a pattern is converted autonomously to a stable dynamic pattern such as a rotating spiral pattern and the information is stored in the form of the dynamic pattern. The formation of such a dynamic pattern has been verified by computer simulations. Specifically, the dynamic pattern is a charge distribution state, for example. The operation that a dynamic pattern is formed autonomously is based on the basic principle that the system tends to make a transition to a state that is stable in terms of energy. In this method, information is stored in the form of a dynamic pattern; in other words, information is stored with extension to the time-axis direction. Therefore, in contrast to conventional semiconductor memories that are based on spatially fixed storage, the method of the present invention enables storage of extremely low power consumption and a high density because it is essentially resistant to thermal noise and requires an extremely small number of information carriers per unit of information.

The present invention has been conceived based on the above studies of the inventors.

To attain the above object, according to a first aspect of the invention, there is provided a storage method comprising the steps of diffusing information carriers; and dissipating the information carriers.

According to a second aspect of the invention, there is provided a storage method comprising the steps of inputting information in the form of information carriers; biasing the input information carriers; comparing a number of the input information carriers with a predetermined threshold value, and dissipating the information carriers for a predetermined time if the number of the input carriers exceeds the threshold value; and diffusing the information carriers, whereby the input information is converted to a pattern that is periodic in time.

According to a third aspect of the invention, there is provided a storage device which stores information by utilizing diffusion and dissipation of information carriers.

According to a fourth aspect of the invention, there is provided a storage device comprising means for inputting a distribution of information carriers; information accumulating means having a plurality of information accumulating sections for storing the information carriers in accordance with the input distribution of the information carriers; information carrier diffusing means for diffusing the information carriers accumulated in the information accumulating sections by at least one of an external action and an interaction between the information accumulating sections; information carrier dissipating means for dissipating the information carriers accumulated in the information accumulating sections; and means for outputting a distribution of the information carriers.

According to a fifth aspect of the invention, there is provided an information processing method comprising the steps of diffusing information carriers; and dissipating the information carriers.

According to a sixth aspect of the invention, there is provided an information processing method comprising the steps of inputting information in the form of information carriers; controlling diffusion and dissipation of the input information carriers independently of each other; and outputting information.

According to a seventh aspect of the invention, there is provided an information processing method comprising the steps of inputting information in the form of information carriers; and converting the input information into a pattern that is periodic in time by giving a predetermined bias to the input carriers.

According to an eighth aspect of the invention, there is provided an information processing method comprising the steps of inputting information in the form of information carriers; biasing the input information carriers; comparing a number of the input information carriers with a predetermined threshold value, and dissipating the information carriers for a predetermined time if the number of the input carriers exceeds the threshold value; and diffusing the information carriers, whereby the input information is converted to a pattern that is periodic in time.

According to a ninth aspect of the invention, there is provided an information processing method comprising the steps of inputting information in the form of information carriers; biasing the input information carriers; comparing a number of the input information carriers with a predetermined threshold value, and dissipating the information carriers for a predetermined time if the number of the input carriers exceeds the threshold value; diffusing the information carriers; converting the input information to a pattern that is periodic in time; and processing the pattern.

The processing to be performed on the pattern that is periodic in time includes general operations as well as pattern comparison, filtering, etc.

According to a 10th aspect of the invention, there is provided an information processing method comprising the steps of accumulating information carriers in a plurality of information accumulating sections; changing the information carriers accumulated in the information accumulating sections by at least one of an external action and an interaction between the information accumulating sections; dissipating, when information carriers accumulated in any of the information accumulating sections satisfy a predetermined condition, the information carriers accumulated there; and outputting information.

According to an 11th aspect of the invention, there is provided an information processing apparatus which stores information by utilizing diffusion and dissipation of information carriers and performs information processing by using the stored information.

According to a 12th aspect of the invention, there is provided an information processing apparatus comprising means for inputting a distribution of information carriers; information accumulating means having a plurality of information accumulating sections for storing the information carriers in accordance with the input distribution of the information carriers; information carrier diffusing means for diffusing the information carriers accumulated in the information accumulating sections by at least one of an external action and an interaction between the information accumulating sections; information carrier dissipating means for dissipating the information carriers accumulated in the information accumulating sections; and means for outputting a distribution of the information carriers.

In the invention, basically the information carrier may be anything and may or may not have charge. Specific examples of the information carrier are an electron and an ion.

In the invention, at least one of the diffusion and the dissipation processes is nonlinear. It is most typical that both of them are nonlinear. A typical example of the pattern that is periodic in time is a rotating spiral pattern on the time axis.

In the invention having the above constitution, for example, information is input as a distribution of information carriers and autonomously converted to a dynamic pattern such as a rotating spiral pattern through information carrier diffusion and dissipation processes. The input information is stored because the dynamic pattern is conserved.

BRIEF DESCRIPTION OF THE DRAWINGS

FIG. 3 is a graph showing an I-V characteristic of tunnel coupling between quantum dots in the nonlinear coupling oscillator array according to the first embodiment;

FIG. 4 is a graph showing a t-V characteristic of a gate in the nonlinear coupling oscillator array according to the first embodiment;

FIGS. 5A–5D are diagrams showing the operation of the nonlinear coupling oscillator array according to the first embodiment;

DETAILED DESCRIPTION OF THE PREFERRED EMBODIMENTS

Figure 1:
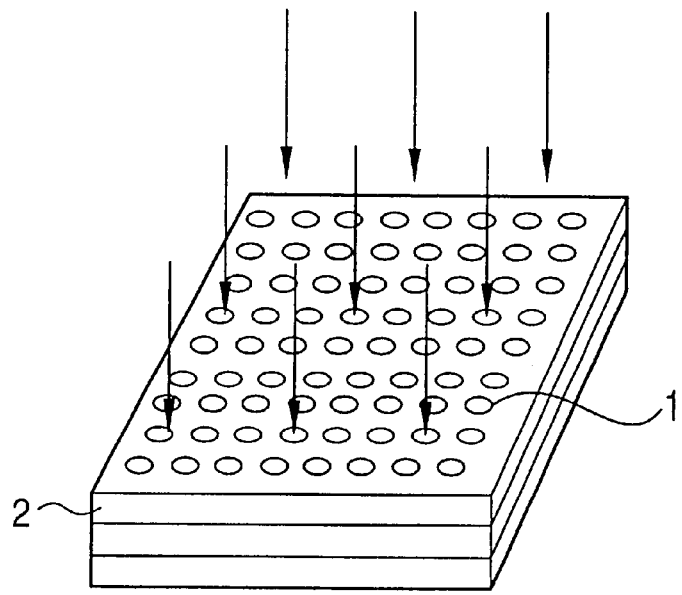
FIG. 1 is a perspective view of a nonlinear coupling oscillator array according to a first embodiment of the present invention.

Two embodiments of the present invention will be hereinafter described with reference to the accompanying drawings. In all the drawings for illustrating the embodiments, the same or corresponding parts or components are given the same reference numerals.

FIG. 1 conceptually shows a nonlinear coupling oscillator array according to the first embodiment of the invention. As shown in FIG. 1, this nonlinear coupling oscillator array is configured in such a manner that a plurality of layers 2 in each of which a number of quantum dots 1 as oscillators are arranged two-dimensionally are laid one on another. As for the principle of operation, the quantum dot 1 has a function of accumulating charge whose amount is varied over time by an external action or an interaction with the vicinity. For example, a silicon crystal cluster, a fullerene $C_{60}$ molecule, and other collected bodies of the same or different atoms can be used as the quantum dot 1. The quantum dot 1 is of a nanometer scale. Further, to effectively utilize a tunnel phenomenon (described later) as an interaction between adjacent quantum dots 1, the interval between adjacent dots 1 is also of a nanometer scale.

To simplify the description, the following description will be directed to a case where the number of layers 2 is two; that is, a detailed description will be made of a nonlinear coupling oscillator array having a two-layer structure.

Figure 2:
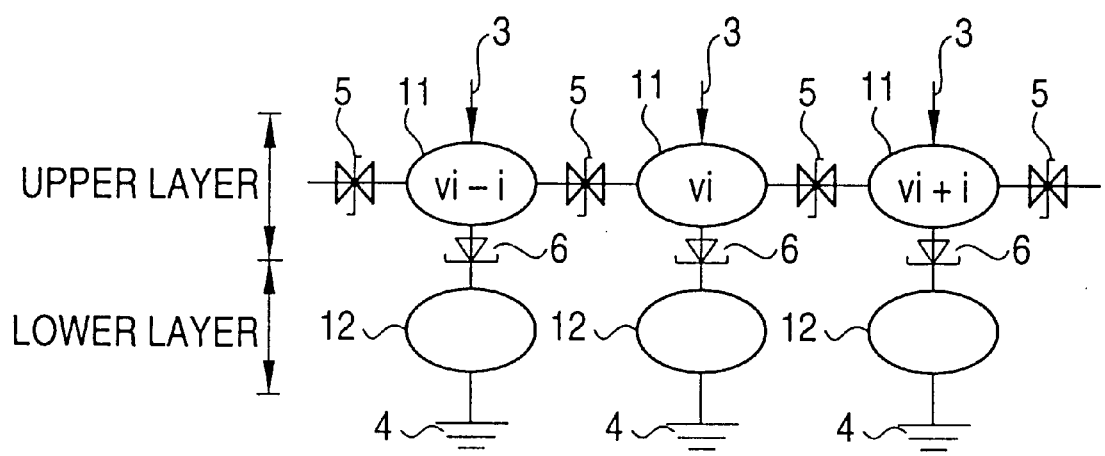
FIG. 2 is a vertical sectional view of a nonlinear coupling oscillator array according to the first embodiment.

FIG. 2 is a schematic vertical sectional view of a nonlinear coupling oscillator array having a two-layer structure. In FIG. 2, reference numerals 11 and 12 denote quantum dots belonging to an upper layer 2 and a lower layer 2, respectively. In this case, adjacent quantum dots 11 belonging to the upper layer 2 interact with each other. The quantum dots 11 receive an input of initial data/bias current 3 and each quantum dot 11 is coupled with one quantum dot 12 in the lower layer 2 via a gate function having a time constant. Initial data are given as a charge distribution for the quantum dots 11 in the upper layer 2. For example, initial data are inputted by a separate mechanism for applying light to the upper layer 2, generating electron-hole pairs so that they are distributed in accordance with a light intensity profile, and injecting resulting electrons into the quantum dots 11 in the upper layer 2. Bias current is given by injecting electrons into the quantum dots 11 in the upper layer 2 constantly in time and space. For example, bias current is inputted by making the light intensity constant temporally and spatially in the above method of injecting electrons by light illumination, or by applying an electric field that is constant temporally and spatially in the vertical direction. On the other hand, horizontally adjacent quantum dots 12 belonging to the lower layer 2 do not interact with each other and the quantum dots 12 are grounded, that is, connected to the ground 4.

Reference numeral 5 denotes a symbol representing tunnel coupling between horizontally adjacent quantum dots 11 in the upper layer 2. FIG. 3 is a graph showing an I-V (current-voltage) characteristic of the tunnel coupling. As shown in FIG. 3, the I-V characteristic of the tunnel coupling is a nonlinear characteristic that is a combination of two different linear relationships. More specifically, in this example, the I-V curve is bent, that is, rises, at a certain threshold voltage.

Returning to FIG. 2, reference numeral 6 denotes a gate that provides a gate function having a time constant and couples a quantum dot 11 of the upper layer 2 with a quantum dot 12 of the lower layer 2. FIG. 4 is a graph showing a t-V (time-voltage characteristic of the gate 6. As shown in FIG. 4, the gate 6 is opened when the amount of charge in the associated quantum dot 11 exceeds a certain threshold value, whereby the entire charge in the quantum dot 11 is dissipated to the ground 4. The gate 6 has a property that it is not closed in a period corresponding to a certain time constant. While the gate 6 is opened, the associated quantum dot 12 is kept in a charge-free state, i.e., a 0-V state. After a lapse of the period corresponding to the time constant, the gate 6 is closed. Because of the constant bias current being injected into the quantum dot 11, the charge in the quantum dot 11 gradually increases though it diffuses in the horizontal direction. If the amount of charge exceeds the threshold value, the gate 6 is again opened and the entire charge is dissipated to the ground 4. The above series of operations is repeated. In a simulation example described later, the threshold value is 128 in terms of the number of electrons, the bias current injected into the upper layer 2 is 6 electrons per time step (1 time step: 0.1 ms), and the time constant is 20 time steps, that is, 2 ms.

The above series of operations will be described again with reference to FIGS. 5A–5D, which show respective ones of the series of operations. In FIGS. 5A–5D, quantum dots 11 in the upper layer 2 are shown as a potential well array. FIG. 5A shows writing of initial data. In FIG. 5A, electrons of a number corresponding to information to be written are given, as initial data, to each of the quantum dots 11 at different locations as shown in FIG. 5A. FIG. 5B shows a bias current. In FIG. 5B, electrons are given to the quantum dots 11 uniformly. FIG. 5C shows that a gate 6 is opened when the amount of charge in the associated quantum dot 11 has exceeded the threshold value, whereby the charge of the quantum dot 11 is released to the ground 4. FIG. 5D shows how electrons diffuse in the horizontal direction. The diffusion shown in FIG. 5D always occurs between the quantum dots 11. That is, the diffusion of electrons actually occur also in the processes of FIGS. 5A–5C though it is not shown in FIGS. 5A–5C to simplify the description.

As described above, the amount of charge in each quantum dot 11 in the upper layer 2 performs nonlinear oscillation in a sense that it is not expressed by a simple function of time such as a sine or cosine function. Therefore, the word "nonlinear"in the term "nonlinear coupling oscillator" should be construed as modifying both of "coupling" and "oscillator."

Figure 6:
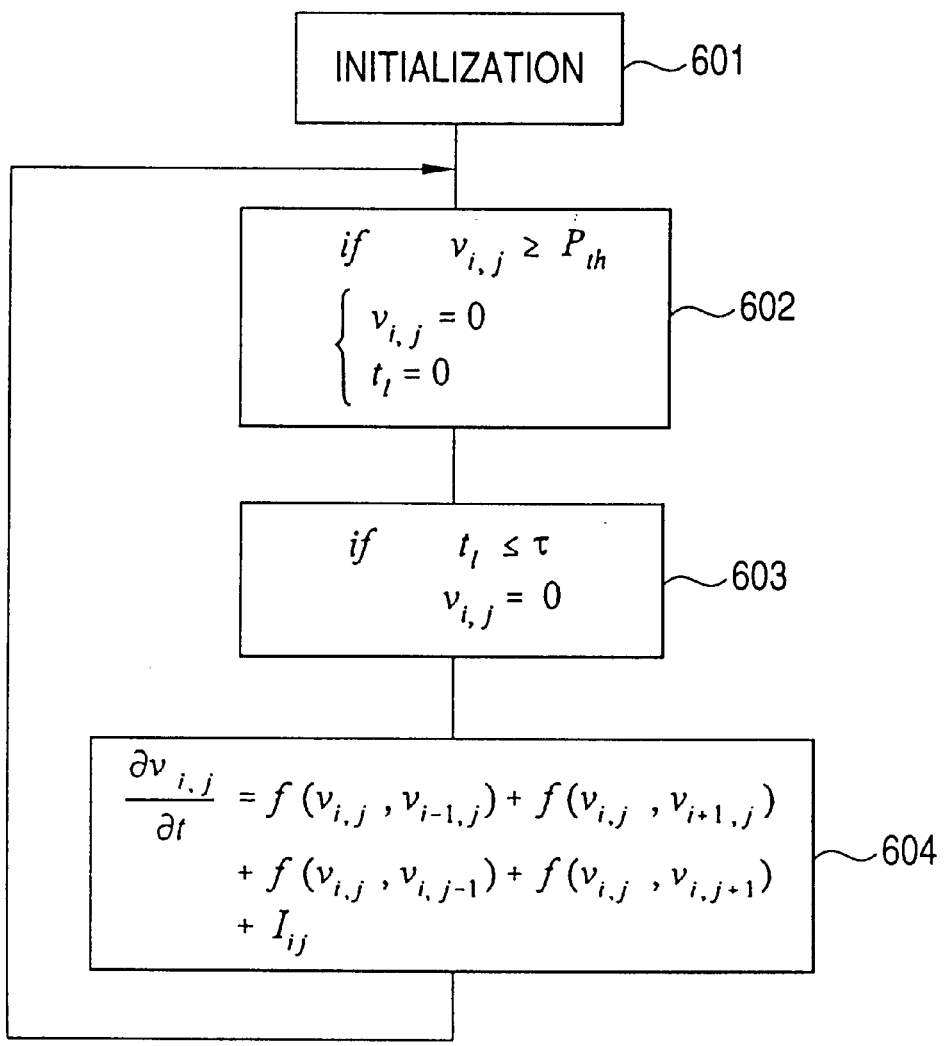
FIG. 6 is a flowchart showing, in the form of a mathematical model, the operation of the nonlinear coupling oscillator array according to the first embodiment.

FIG. 6 is a flowchart showing the operation of the nonlinear coupling oscillator array in the forms of a mathematical model. In FIG. 6, $v_{ij}$ represents the amount of charge accumulated in an ij-th quantum dot 11; $P_{th}$, the threshold value of each gate 6; t, the progressive time step; τ, the time constant that defines the time necessary for each gate 6 to be closed after discharging; f, a function representing nonlinear horizontal diffusion; and $I_{ij}$, the bias current. In FIG. 6, reference numeral 601 denotes a step of initial data writing, 602 denotes a step in which the amount $v_{ij}$ of charge accumulated in a quantum dot 11 decreases to 0 at a time point when it has exceeded the threshold value $P_{th}$, 603 denotes a step in which 0 V is maintained during the period corresponding to the time constant τ, and 604 denotes a step representing the interaction due to the coupling between adjacent quantum dots 11 and the bias current $I_{ij}$.

Next, results (simulation results) caused by the above-described nonlinear coupling oscillator array will be described.

Figure 7A:
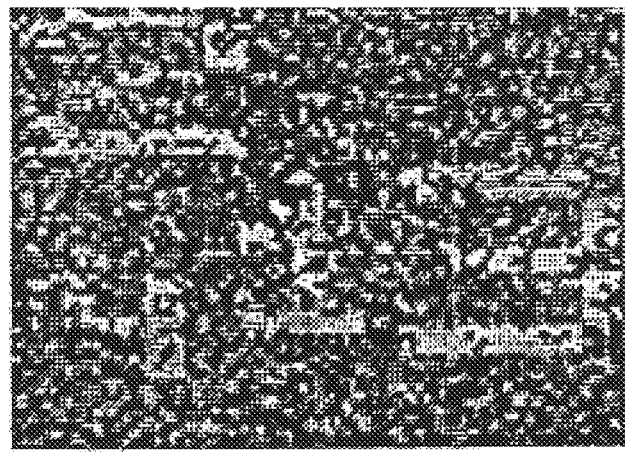
FIGS. 7A and 7B show an example simulation result in which a dynamic pattern appears in the nonlinear coupling oscillator array according to the first embodiment.
Figure 7B:
Figure 8A:
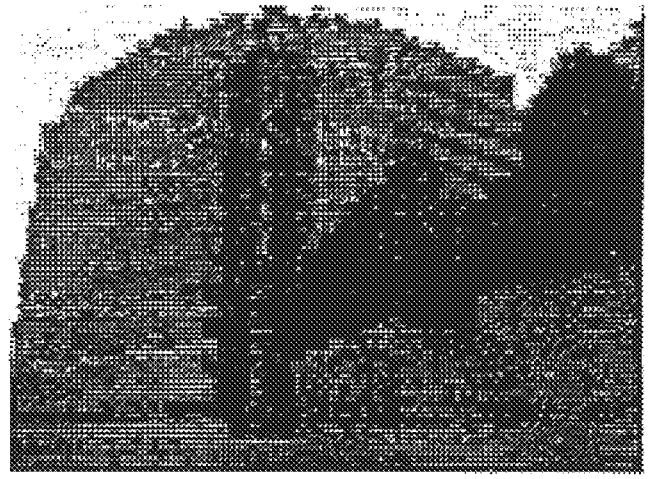
FIGS. 8A and 8B show another example simulation result in which a dynamic pattern appears in the nonlinear coupling oscillator array according to the first embodiment.
Figure 8B:

FIGS. 7A–7B and 8A–8B show simulation results that were obtained with a nonlinear coupling oscillator array having 88×64 quantum dots and in which different dynamic patterns appeared after a lapse of a certain time in accordance with different initial conditions, that is, different initial data. FIGS. 7A and 8A show initial data as charge distributions each corresponding to gray-scale of a still image. FIGS. 7B and 8B show patterns that are obtained after a lapse of 3,000 steps (i.e., 300 ms) starting from the patterns of FIGS. 7A and 8A, respectively. In these examples, each dynamic pattern is obtained as a result of a phase transition that occurs after a lapse of 1,000 steps (100 ms) from the start. The dynamic patterns of FIGS. 7B and 8B are characterized by a rotating spiral pattern corresponding to an electron concentration profile. Since the positions and the rotation directions of respective rotating spirals are conserved though a rotating spiral pattern moves, the pattern can be identified by setting parameters representing those positions and rotating directions in advance. Data as converted to a dynamic pattern that is typified by the patterns of FIGS. 7B and 8B continue to move and are not lost as long as the above operation continues. The operation that such a dynamic pattern is formed autonomously is based on the basic principle that the system tends to make a transition to a stable state in terms of energy.

Figure 9A:
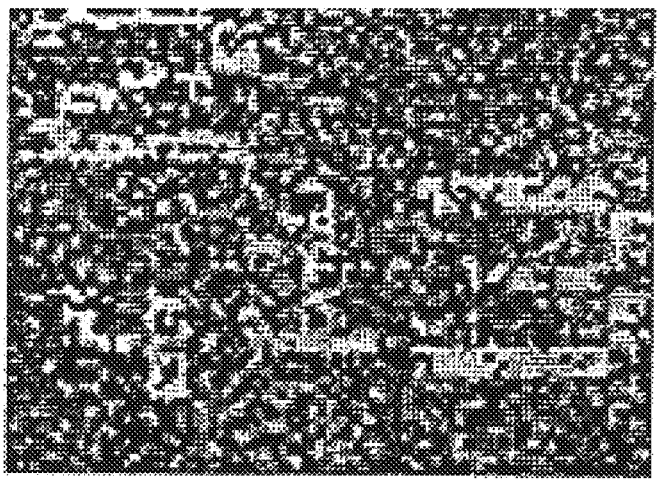
FIGS. 9A and 9B show an example simulation result where bias current is not given in the nonlinear coupling oscillator array according to the first embodiment.
Figure 9B:
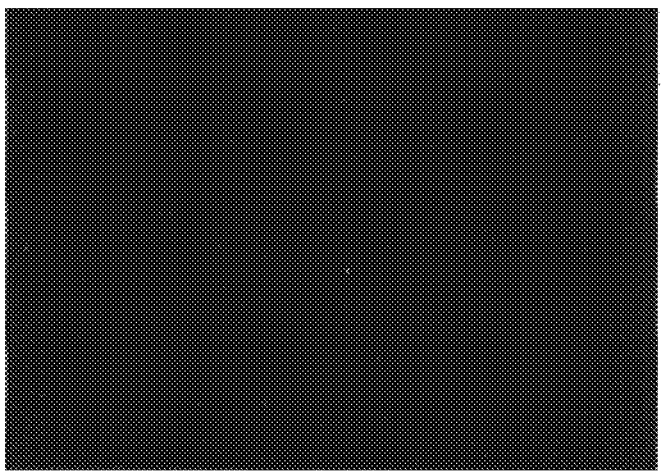

On the other hand, in a case where bias current is not applied and hence neither nonlinear oscillations nor dissipation occurs, only diffusion occurs. Therefore, when, for example, a charge distribution corresponding to gray-scale of a still image shown in FIG. 9A is used as initial data, the data become uniform and hence are lost after a lapse of 100 steps (10 ms) as shown in FIG. 9B.

Figure 10:
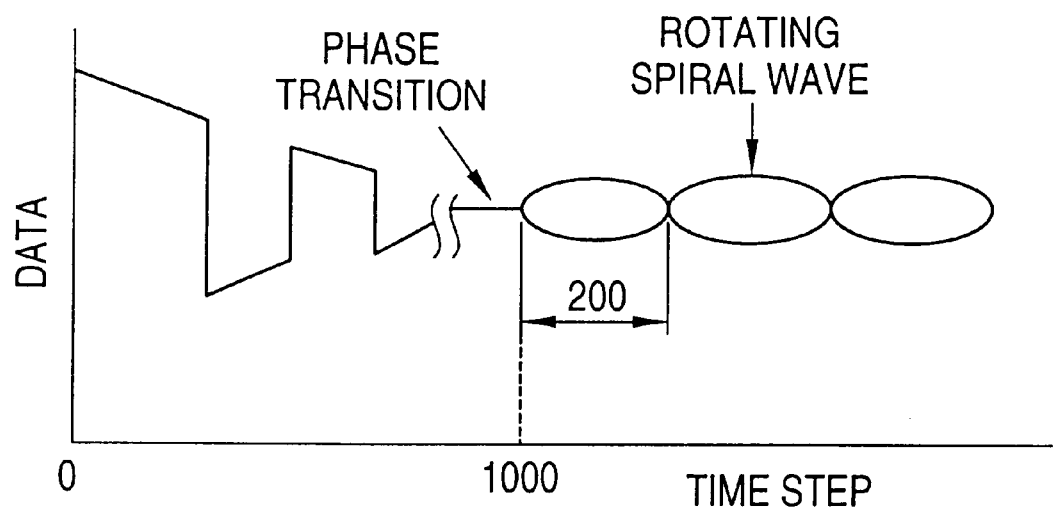
FIG. 10 is a diagram showing how a rotating spiral pattern appears as time elapses in the nonlinear coupling oscillator array according to the first embodiment.
Figure 11:
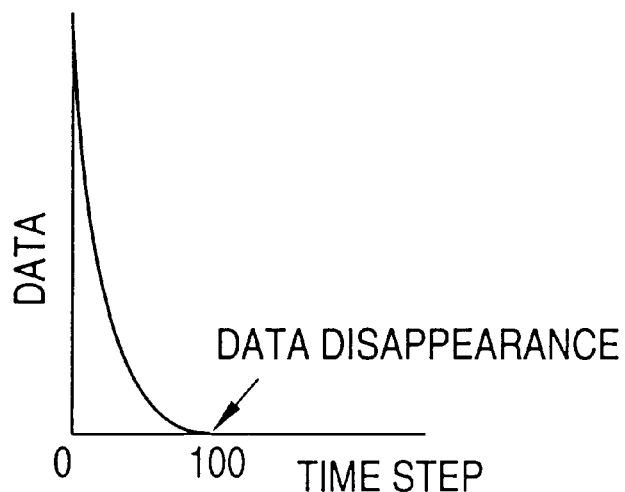
FIG. 11 is a diagram showing how data is lost as time elapses in a case where bias current is not given in the nonlinear coupling oscillator array according to the first embodiment.

FIG. 10 schematically shows a time-data characteristic of the nonlinear coupling oscillator array. As shown in FIG. 10, in this nonlinear coupling oscillator array using bias current, a phase transition occurs after a lapse of a certain time (1,000 time steps in this example; 1 time step is 0.1 ms) and a rotating spiral wave is generated that can be said to be substantially periodic. On the other hand, when bias current is not used, data rapidly decays as time elapses and finally disappears (after a lapse of 100 time steps in this example) as shown in FIG. 11.

The first embodiment provides the following many advantages. In conventional semiconductor memories, the operation becomes unstable when miniaturization of a submicron or even smaller scale is performed, because operation in based on spatially fixed storage. In contrast, the nonlinear coupling oscillator array according to the first embodiment has a miniaturized structure of a nanometer scale and stores information with extension to the time-axis direction. Therefore, the nonlinear coupling oscillator array is free of the above problem and is capable of stable pattern storage in spite of its miniaturized structure.

While conventional semiconductor memories need tens of thousands of electrons for each cell to overcome thermal noise, the nonlinear coupling oscillator array of the first embodiment can operate with tens of electrons per cell, that is, per quantum dot and hence is extremely low in power consumption.

The manufacture of conventional semiconductor memories requires wiring forming technologies that are based on lithography. Therefore, from the viewpoint of the process, it has been considered that-miniaturization of a submicron or even smaller scale is very difficult and lithography of 0.01 micron or less is impossible. In contrast, the first embodiment does not require wiring because tunnel coupling between quantum dots that is formed by such a process as self-organization is used as the main interaction. As a result, miniaturization down to a nanometer scale or even a sub-nanometer scale is possible. Further, since the nonlinear coupling oscillator array of the first embodiment is a combined body of quantum dots and has a simple structure, it can easily be increased in scale and is advantageous in cost.

The nonlinear coupling oscillator array of the first embodiment is suitable for use as a storage device or a storage section of an information processing apparatus.

Although in the first embodiment an electron concentration profile in the upper layer 2 of the nonlinear coupling oscillator array is used as an output pattern, an output pattern can be detected by different methods. For example, since an electron concentration profile in the lower layer 2 has clear correlation with that in the upper layer 2, the pattern of an electron concentration profile in the lower layer 2 can be used as an output. Since an electron concentration pattern in the lower layer 2 has correlation with the number of electrons that are released to the ground 4 (see FIG. 2) in unit time, the number of electrons per unit time, that is, the charge amount per unit time, can be detected by a charge transfer device. On the other hand, an initial charge distribution pattern as input information can be realized by forming a photodetector array in a layer above the upper layer 2 and converting (transferring) a light intensity profile pattern as input information to a charge distribution pattern. The second embodiment of the invention is directed to such a nonlinear coupling oscillator array.

Figure 12:
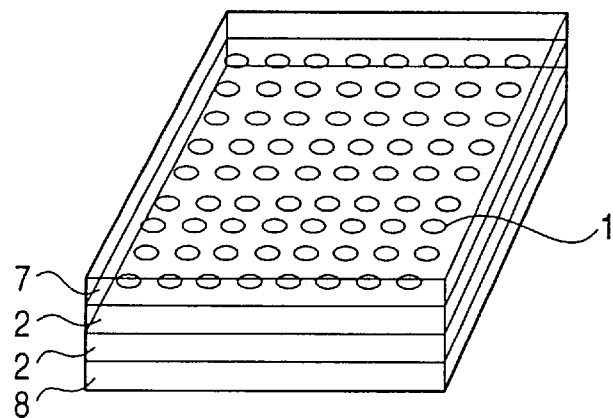
FIG. 12 is a perspective view of a nonlinear coupling oscillator array according to a second embodiment of the invention.
Figure 13:
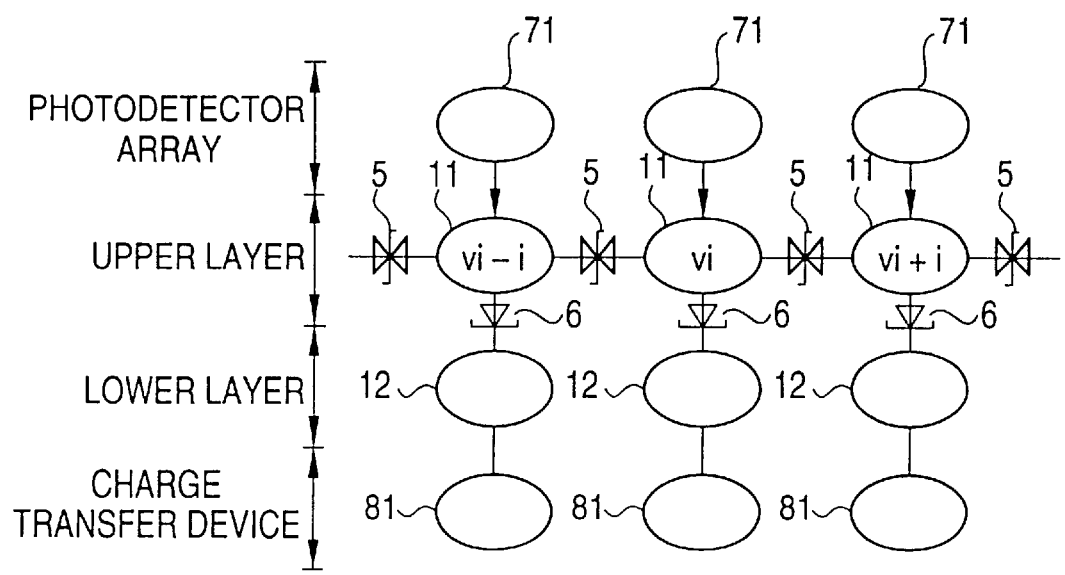
FIG. 13 is a vertical sectional view of the nonlinear coupling oscillator array according to the second embodiment.

FIG. 12 is a perspective view of a nonlinear coupling oscillator array according to the second embodiment of the invention. FIG. 13 is a schematic vertical sectional view of the same nonlinear coupling oscillator array. As shown in FIGS. 12 and 13, the nonlinear coupling oscillator array according to the second embodiment is configured in such a manner that a photodetector array 7 and a charge transfer device 8 are provided above and below a nonlinear coupling oscillator array having a two-layer structure that is the same as in the first embodiment, respectively. In the photodetector array 7, photodetectors 71 are provided at positions corresponding to the respective quantum dots 11 in the upper layer 2 of the nonlinear coupling oscillator array having a two-layer structure. In the charge transfer device 8, charge input sections 81 are provided at positions corresponding to the respective quantum dots 12 in the lower layer 2 of the nonlinear coupling oscillator array having a two-layer structure.

In the nonlinear coupling oscillator array according to the second embodiment, light having an intensity profile corresponding to input information is applied to the photodetector array 7 from above, whereby electron-hole pairs are generated in the photodetectors 71 and resulting electrons are injected into and accumulated in the quantum dots 11 corresponding to the respective photodetectors 71. After occurrence of the same processes as in the first embodiment, electrons are injected into the charge input sections 81 of the charge transfer device 8 from the respective quantum dots 12 of the lower layer 2. Electrons that have been input to the charge input sections 81 are moved through channels (not shown) and an electrical signal reflecting an electron concentration profile (pattern) in the lower layer 2 is output from a proper output section.

The second embodiment provides the same advantages as the first embodiment.

Although the invention has been described above in a specific manner maner by using the embodiments, the invention is not limited to those embodiments and various modifications are possible without departing from the technical concept of the invention.

For example, the numerical values and structures employed in the first and second embodiments are just examples and numerical values and structures different than in the embodiments may be used when necessary.

As described above, the storage method and device according to the invention enables information to be stored stably at a high density with low power consumption without being influenced by thermal noise.

Further, the information processing method and apparatus according to the invention enables information to be stored stably at a high density with low power consumption without being influenced by thermal noise, as well as enables desired information processing that uses information thus stored.

What is claimed is:

1. A storage method comprising the steps of:
    inputting information in the form of information carriers having a pre-determined pattern into a plurality of information accumulating sections;
    biasing said information accumulating sections by inputting information carriers into said information accumulating sections constantly in time and space;
    comparing a number of information carriers in an accumulating section with a predetermined threshold value and dissipating the information carriers for a predetermined time if the number of information carriers exceeds the threshold value;
    diffusing the information carriers in an accumulating section to adjacent horizontal accumulating sections; and
    generating an output pattern that is periodic in time.

2. The storage method of claim 1 where at least one of said dissipating steps or said diffusing steps is nonlinear.

3. The storage method of claim 1 wherein said information carriers are electrons.

4. The storage method of claim 1 wherein said output pattern is a rotating spiral pattern.

5. The storage method of claim 1 wherein said diffusing and dissipating of said information carriers occurs independently of each other.

6. The storage method of claim 1 wherein said biasing is by exposing said information accumulating sections to light having a constant intensity both temporally and spatially.

7. The storage method of claim 1 wherein said information accumulating sections comprise quantum dots.

8. The storage method of claim 7 wherein said quantum dots are either a silicon crystal cluster or a fullerene $C_{60}$ molecule.

9. The storage method of claim 1 wherein said dissipation occurs by a gate which opens at said threshold value.

10. A storage method comprising:
   providing a storage device;
      said device having a plurality of layers;
         wherein said plurality of layers includes at least one upper layer and one lower layer, each have a plurality of quantum dots;
         wherein horizontal adjacent quantum dots in said upper layer can undergo tunnel coupling;
         wherein a quantum dot in said upper layer is gated to a corresponding quantum dot in said lower layer;
   receiving initial data in the form of electrons having a distribution pattern in said quantum dots of the upper layer;
   providing a bias current by injecting electrons into the quantum dots in the upper layer constantly in time and space;
   dissipating the electrons in a quantum dot in said upper layer at a predetermined threshold value of charge; and
   diffusing electrons in a horizontal direction between adjacent quantum dots in said upper layer.

11. The storage device of claim 10 wherein said quantum dot is of a nanometer scale.

12. The storage device of claim 11 wherein said quantum dots in said lower layer are connected to a ground potential.

13. The storage device of claim 10 wherein said quantum dot is either a silicon crystal cluster or a fullerine $C_{60}$ molecule.

14. The storage method of claim 10 wherein said initial data is generated by exposure to light having said distribution pattern.

15. the storage device of claim 10 wherein said quantum dots in said lower layer do not interact with each other.

16. A storage device comprising:
   a plurality of layers, wherein said plurality of layers includes at least one upper layer and one lower layer, each have a plurality of quantum dots;
      wherein horizontal adjacent quantum dots in said upper layer can undergo tunnel coupling;
      wherein a quantum dot in said upper layer is gated to a corresponding quantum dot in said lower layer;
      wherein said quantum dots in said lower layer are grounded; and
   a biasing means for applying information carriers and initial data to said quantum dots constantly in time and space.

17. The storage device of claim 16 wherein said quantum dot is of a nanometer scale.

18. The storage device of claim 16 wherein said quantum dot is either a silicon crystal cluster or a fullerine $C_{60}$ molecule.

19. The storage device of claim 16 wherein said initial data is a charge distribution from light.

20. The storage device of claim 16 wherein said quantum dots in said lower layer do not interact with each other.

21. The storage device of claim 16 wherein said quantum dots in said lower layer are connected to a ground potential.

* * * * *